United States Patent [19]

Besson

[11] 4,221,986
[45] Sep. 9, 1980

[54] PIEZOELECTRIC RESONATOR WITH IMPROVED SUSPENSION

[75] Inventor: Raymond J. Besson, Besancon, France

[73] Assignee: Laboratoires de Physicochimie Appliquees ISSEC and KDP Societe anonyme Keller Dorian Papiers, Lyon, France

[21] Appl. No.: 920,675

[22] Filed: Jun. 30, 1978

[51] Int. Cl.² .......................................... H01L 41/10
[52] U.S. Cl. ................... 310/344; 310/346; 310/361; 310/369; 310/351; 310/352; 310/353
[58] Field of Search ............... 310/344, 346, 360, 361, 310/351–353, 367, 369

[56] References Cited

U.S. PATENT DOCUMENTS

| | | | |
|---|---|---|---|
| Re. 26,707 | 11/1969 | Cutler et al. | 310/349 X |
| 1,907,986 | 5/1933 | Little | 310/353 X |
| 2,224,891 | 12/1940 | Wright | 310/367 X |
| 2,264,692 | 12/1941 | Gerber | 310/367 X |
| 2,301,269 | 11/1942 | Gerber | 310/367 X |
| 3,069,572 | 12/1962 | Dick et al. | 310/353 |
| 3,561,832 | 2/1971 | Karrer et al. | 310/367 X |
| 3,617,780 | 11/1971 | Benjaminson et al. | 310/346 X |
| 3,694,677 | 9/1972 | Guttwein et al. | 310/320 X |

FOREIGN PATENT DOCUMENTS

| | | | |
|---|---|---|---|
| 2701200 | 7/1977 | Fed. Rep. of Germany | 310/346 |
| 990206 | 9/1951 | France | 310/351 |
| 44-17194 | 6/1965 | Japan | 310/367 |

*Primary Examiner*—Mark O. Budd
*Attorney, Agent, or Firm*—Lewis H. Eslinger

[57] ABSTRACT

Piezoelectric resonator comprising a sealed box in which a vacuum has been formed or into which has been introduced a residual gas, within said box a piezoelectric crystal having first and second main opposite faces, a first metal electrode deposited on the first main face of the crystal and a second metal electrode deposited on the second main and opposite faces of the crystal, a first conductor connected to the first electrode and extending outside the box, a second conductor connected to the second electrode and extending outside the box and means for maintaining the crystal within the box, wherein the piezoelectric crystal comprises a central portion and a peripheral portion forming a ring which spacedly surrounds the central portion and connected to said central portion by an intermediate portion which over at least part of the distance between the central portion and the peripheral portion has a reduced thickness compared with the thickness of said central and peripheral portions wherein the first and second electrodes are deposited on one of said central and peripheral portions which then constitutes the active part of the crystal, while the other portion which does not carry electrodes is immobilized in the box by retaining means which act in localized zones, the intermediate portion of the crystal and said immobilized portion constituting the suspension means for the active part of the crystal.

9 Claims, 10 Drawing Figures

PIEZOELECTRIC RESONATOR WITH IMPROVED SUSPENSION

BACKGROUND OF THE INVENTION

The invention relates to a piezoelectric resonator comprising a sealed box in which a vacuum has been formed or into which has been introduced a residual gas, within said box a piezoelectric crystal having first and second main opposite faces, a first metal electrode deposited on the first main face of the crystal and a second metal electrode deposited on the second main and opposite face of the crystal, a first conductor connected to the first electrode and extending outside the box, a second conductor connected to the second electrode and extending outside the box and means for maintaining crystal within the box.

The presently known high performance quartz resonators are almost entirely of the type having electrodes adhering to the crystal. In such a resonator, the quartz crystals are conventionally suspended by two or three thin nickel strips, which constitute the connection between the electrodes and the contacts outside the metal envelope or tube constituting the box of the resonator. These thin metal strips, which have both an electrical and a mechanical function, are connected to the quartz by cement, thermocompression bonding, welding, etc. Moreover, in the prior art, it is difficult to precisely locate the suspension points, provide reproducible attachments and prevent inadequately known stresses at the attachment points.

The cavity resonator of the type with electrodes adhering to the crystal has an essential limitation due to the imperfect limiting conditions, i.e. mainly to surface defects limiting the piezoelectric solid and to the suspension of the crystal. Attempts have been made to limit the faults caused by the fixing of the crystal by locating the fixture outside the active part of the crystal, i.e. outside the zone corresponding to that part of the quartz capsule between the electrodes and where the energy is trapped.

However, the fixing of the electrodes to the edge or face of the crystal by thermocompression bonding, cementing or other means is by its very nature discontinuous (for example quartz—metal bonding or presence of a cement) and causes perturbations to which the resonator frequency is sensitive.

BRIEF SUMMARY OF THE INVENTION

The object of the present invention is to obviate the above disadvantages and to provide a piezoelectric resonator with adherent electrodes whose suspension is improved in such a way as to eliminate the fixing discontinuities, reduce the perturbations caused on the active part of the crystal and define the fixing parameters with a high level of precision.

These objects are achieved by means of a resonator of the type defined hereinbefore, wherein the piezoelectric crystal comprises a central portion and a peripheral portion forming a ring which spacedly surrounds the central portion and connected to said central portion by an intermediate portion which over at least part of the distance between the central portion and the peripheral portion has a reduced thickness compared with the thickness of said central and peripheral portions wherein the first and second electrodes are deposited on one of said central and peripheral portions which then constitutes the active part of the crystal, whilst the other portion which does not carry electrodes is immobilised in the box by retaining means which act in localised zones, the intermediate portion of the crystal and said immobilised portion constituting the suspension means for the active part of the crystal.

As a result of the even limited narrowing of the crystal section in its intermediate portion, the active part is mechanically isolated from the part to which are fixed the supporting means. Thus, there is no discontinuity in the suspension of the active zone of the crystal and the stresses transmitted to the active part of the crystal are reduced, whilst the supporting means and supply conductors of the electrodes remain positioned in punctiform zones of the immobilised part of the crystal.

According to an advantageous feature of the invention, recesses are formed in the intermediate tapered part of the crystal in such a way that the peripheral portion of the crystal is connected to the central portion of the crystal by a limited number of bridges constituted by non-recessed parts of the intermediate portion.

Thus, numerous possibilities of improving the quality of the suspension or mechanical adaptation are provided by acting on the thickness of the connecting bridge or bridges, on their positioning, length, shape, number, etc. Each of these parameters can be individually controlled. In particular, it is possible to provide a completely symmetrical suspension relative to the active portion of the crystal or which has certain symmetry characteristics. The intermediate tapered portion can in particular have an annular configuration.

According to the applications envisaged, the active portions of the crystal may be constituted by the central or peripheral portion of the crystal.

According to a special embodiment, the means for retaining the crystal, which is for example a quartz crystal, are fixed to the peripheral portion of the crystal at points remote from the connecting bridges. The connecting bridges may be positioned with a high level of accuracy, both relative to the edge or face of the crystal and angularly on its periphery.

The conductor wires for the power supply to the electrodes are also connected to the immobilised part of the crystal, preferably at points remote from the connecting bridges between said central and peripheral portions, and are connected to the electrodes by metal deposits made on the immobilised and intermediate portions of the crystal.

The retaining means for supporting the crystal in the enclosure may advantageously be constituted by conductors wires for supplying power to the electrodes.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
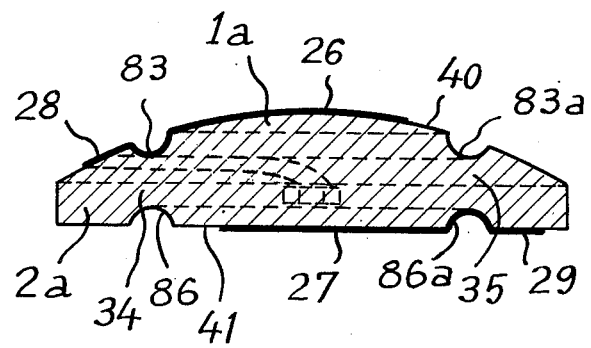
FIG. 1 a sectional view along the line I—I of FIG. 2 of an example of a piezoelectric crystal equipped with its electrodes which constitutes the basic element of a resonator according to the invention.
Figure 2:
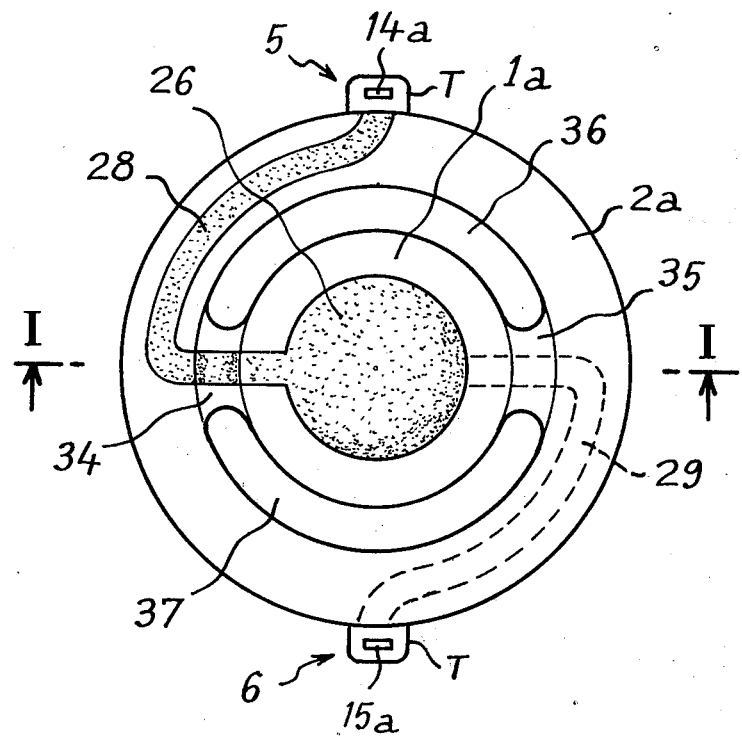
FIG. 2 a plan view of the piezoelectric crystal of FIG. 1.

FIGS. 1 and 2 show the basic elements of a resonator according to the invention, namely a piezoelectric crystal 1a, 2a, for example a quartz crystal, supporting means 5, 6 for crystal 1a, 2a, electrical conductors 14a, 15a and electrodes 26, 27 connected to conductors 14a, 15a respectively by metal paths 28, 29 deposited on the crystal. The sealed enclosure constituting the resonator body and within which are diposed the above-defined elements is not shown in the drawings and may be constituted in conventional manner by a metal box or glass bulb for example. Within said enclosure is formed a high vacuum or a residual atmosphere (hydrogen, helium, nitrogen, etc). Conductors 14a, 15a connected to the edge of crystal 2a, for example by thermocompression bonding T or by cementing respectively to the metal paths 28, 29 corresponding to electrodes 26, 27 may also serve as a supporting means 5, 6 for crystal 1a, 2a in the sealed enclosure. Conductor wires 14a, 15a pass to the outside of the enclosure via insulated openings.

Crystal 1a, 2a may have different configurations, which depend on the envisaged applications. Thus, it is possible to use crystals which are flat convex, biconvex, biplanar, etc. FIGS. 1 and 2 show as an example a flat convex circular crystal having a lower planar face 41 and an upper convex face 40.

The surface of crystal 1a, 2a must be carefully prepared and must have a minimum of faults. In order that the properties of the parts of the crystal adjacent to the surface are as close as possible to the properties of the inside of the crystal, processes which geometrically form the surface (grinding, polishing) are alternated with processes which clean and chemically attack it. In conventional manner, the said crystal shaping processes are followed by cleaning and then chemical attack. Finally, crystal 1a, 2a is, according to conventional processes, carefully rinsed and cleaned in solvents such as distilled water, pure acetone and absolute alcohol, prior to the deposition of electrodes 26, 27 and connecting paths 28, 29, for example by vacuum evaporation.

Electrodes 26, 27 which are located on either side of crystal 1a respectively on faces 40 and 41 are in the form of disks in FIG. 2, but could naturally have other configurations. In the embodiment of FIGS. 1 and 2 the central portion 1a of crystal 1a, 2a between the two electrodes 26, 27 constitutes the active part of the crystal, whilst the peripheral portion 2a constitutes an immobilised part ensuring the suspension of the active central zone 1a. An intermediate portion 34, 35, 36, 37 connects the peripheral portion 2a to the central active zone 1a.

The crystal is tapered level with the intermediate portion 34, 35, 36, 37 (FIG. 1) in such a way that grooves 83, 83a, 86, 86a are respectively formed in the upper face 40 and the lower face 41 of crystal 1a, 2a. Naturally, the shape of grooves 83, 83a, 86, 86a can be varied in accordance with the envisaged applications. Grooves 83, 83a, 86, 86a of the intermediate portion 34, 35, 36, 37 form a boundary between the active central portion 1a which is able to vibrate and the peripheral portion 2a which is immobile and integral with the resonator body via supporting means 5, 6. Thus, the active portion 1a of the crystal is autosuspended, because no outside element connects it to the peripheral portion 2a forming a suspension ring. The intermediate portion 34 to 37 introduces no structural discontinuity in the vicinity of the active portion 1a, whilst bringing about a certain mechanical separation from said active portion 1a.

The tapered intermediate portion 34 to 37 obtained for example by grinding is advantageously circular, but may also be given other configurations, in particular as a function of the configuration of the electrodes and the nature of the crystal.

According to a special embodiment of the invention, recesses 36, 37 are made for example by ultrasonic machining in part of the retracted portions separating the central portion 1a and the peripheral portion 2a of the crystal. The active portion 1a of the crystal is thus suspended by two crystalline bridges 34, 35 which connect it to the peripheral portion 2a. However, the crystal may have more than two bridges 34, 35. Thus, the intermediate portion between the central and peripheral portions which has a reduced thickness over at least part of the distance between the active central portion 1a and the peripheral portion 2a may have a varied number of bridges, as a function of the desired mechanical adaptation. If no recess 36, 37 is provided in the intermediate tapered portion and if as a result a single thin bridge extending angularly over an angle of 360° completely surrounds the active portion 1a, the machining of the crystal is extremely easy. Rotary machining, without any complementary ultrasonic machining, may be sufficient and it may even be possible to provide an annular groove 83, 83a in the intermediate portion of the crystal on only a single side, for example on the side of face 40 of the crystal, whereby the opposite annular groove 86, 86a is then eliminated.

The thin bridges 34, 35 constitute suspension points for the active part 1a of the crystal and can be positioned with great accuracy both with regard to the edge of vibrating crystal 1a and angularly on its periphery. In particular, it is possible to realise the perfectly symmetrical suspension or having certain symmetry characteristics. According to the envisaged applications, it is possible to individually modify a large number of parameters, such as the thickness of the bridge or bridges 34, 35, their heightwise positioning relative to the crystal edge, their width, length, shape, positioning in azimuth, etc.

In the case of two thin bridges 34, 35 it is however generally preferable to position these in accordance with the axis ZZ' of the crystal, when the piezoelectric crystal comprises a quartz crystal of section AT.

In general terms, no difficulty is encountered in realising the intermediate portion 34 to 37 of the crystal in such a way that it has an even number of bridges 34, 35, ensuring a suspension symmetry of the active portion of the crystal. Bridges 34, 35 are advantageously disposed relative to the edge of the crystal in such a way that the centre of the bridges essentially coincides with the nodal reference plane of the crystal, which is located approximately in the centre of the thickness of the crystal.

Figure 6:
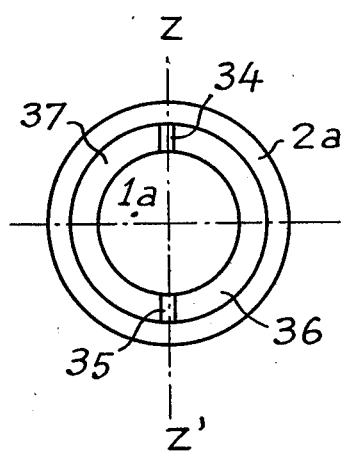
FIGS. 6 and 7 plan views of two examples of piezoelectric crystals which can be used within the scope of the present invention and for which the electrodes are not shown.
Figure 7:
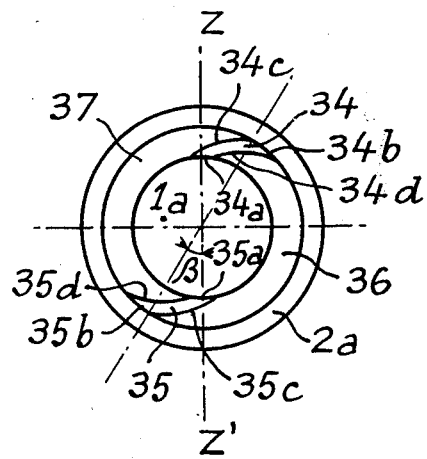

In FIG. 6, it can be seen that the bridges 34, 35 left between recesses 36 and 37 and connecting the central active portion 1a to the fixed peripheral portion 2a of the crystal are radial. However, FIG. 7 shows an embodiment in which end 34b, 35b respectively of a bridge 34, 35 located on the side of peripheral portion 2a is displaced by a certain angle β around the sectional axis relative to end 34a, 35a located respectively on the side of the active central portion 1a, whereby the lateral faces 34c, 34d respectively 35c, 35d of each of the bridges 34 and 35 being curved and having the same direction of curvature.

In the same way, in order to reduce or eliminate residual stresses at the suspension points of the crystal by its peripheral and intermediate portions, it is possible to subject crystal 1a, 2a to treatment prior to its fitting. For example, it is advantageous for the crystal to undergo annealing at approximately 480° C., after which it undergoes a very slight bifluoride attack.

On referring to FIGS. 1 and 2, it can be seen that means 5, 6 for supporting the peripheral portion 2a of the crystal are fixed at points which are preferably remote from connecting bridges 34, 35 between central portion 1a and peripheral portion 2a.

The fixing points of the conductor wired 14a, 15a to the edge of peripheral portion 2a are also preferably located as far as possible from the connecting bridges. The metal paths 28, 29 respectively connecting electrodes 26, 27 to conductors 14a, 15a are deposited on faces 40, 41 of the crystal at the same time as electrodes 26, 27. Metal paths 28, 29 traverse the intermediate portion of the crystal level with thin bridges 34, 35. To facilitate electrical continuity, it is preferable for grooves 83, 86a not to be too deep.

Figure 3:
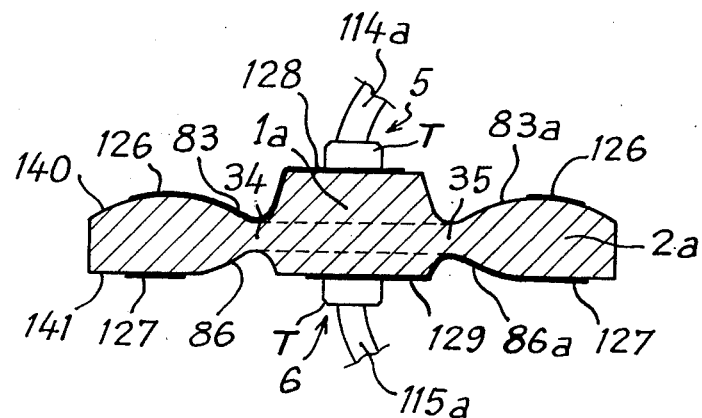
FIG. 3 a sectional view along the line III—III of FIG. 4 of a second embodiment of a piezoelectric crystal equipped with its electrodes and which constitutes the basic element of a resonator according to the invention.
Figure 4:
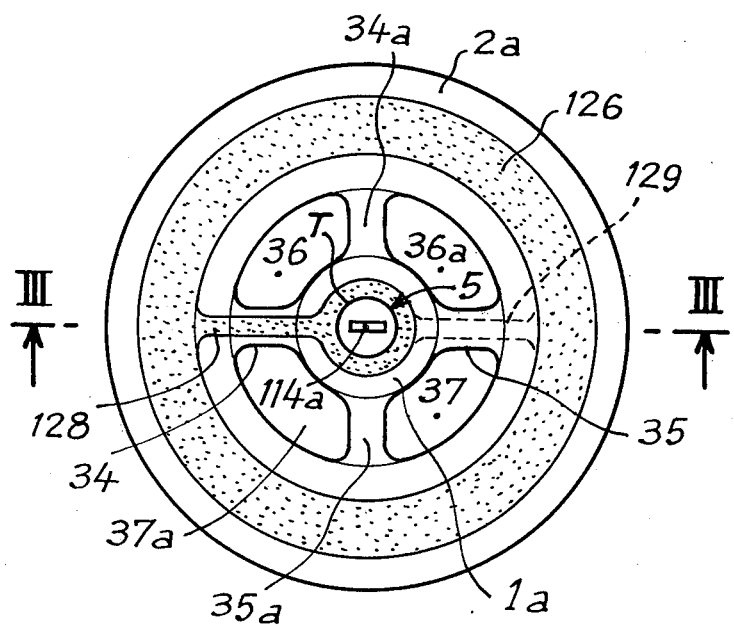
FIG. 4 a plan view of the piezoelectric crystal of FIG. 3.
Figure 5:
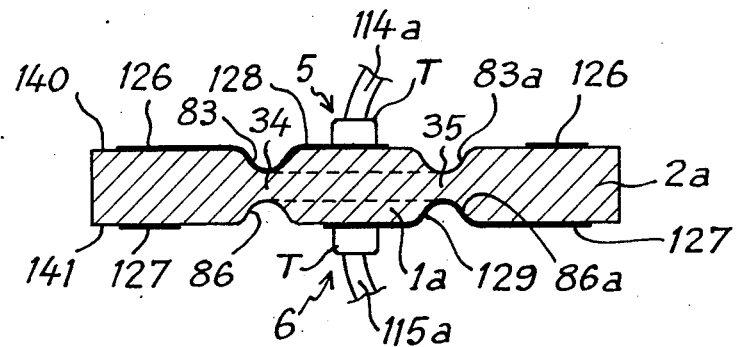
FIG. 5 a sectional view similar to FIG. 3 and showing a variant of the embodiment of FIGS. 3 and 4.

FIGS. 3 to 5 correspond to a second embodiment of the invention. As in the case of FIGS. 1 and 2, the piezoelectric crystal 1a, 2a of FIGS. 3 to 5 comprises a central portion 1a connected to a peripheral portion 2a by an intermediate portion which is tapered relative to central portion 1a and peripheral portion 2a. Like parts in the embodiment of FIGS. 1 and 2 and in the embodiment of FIGS. 3 to 4 are given the same references and all that has been described hereinbefore relative to crystals 1a, 2a and the intermediate portion thereof also applies to the embodiments of FIGS. 3 to 5.

The basic structure of the piezoelectric resonator shown in FIGS. 3 to 5 differs from that of FIGS. 1 and 2 essentially through the fact that electrodes 126, 127 located on either side of the crystal on faces 140, 141 respectively are disposed over the peripheral portion 2a of the crystal, which thus becomes the active part of the resonator, whilst the supporting means 5, 6 of the crystal, which are advantageously constituted by conductors 114a, 115a for the power supply of the electrodes 126, 127 are fixed to the central portion 1a of the crystal, which thus becomes the immobilised part of the resonator. Electodes 126, 127 disposed on the active peripheral portion 2a have a substantially annular configuration and are connected to conductors 114a, 115a by metal paths 128, 129 respectively, which are disposed on faces 140, 141 of the crystal at the same time as electrodes 126, 127 and traverse the intermediate portion level with thin bridges 34, 35. The retaining means 5, 6, for the crystal are preferably fixed to the centre of the central portion 1a thereof, whereby said immobilised central portion 1a can have a greater thickness than the active peripheral portion 2a. Peripheral portion 2a of the crystal may be limited on the upper face 140 and lower face 141 by planar portions (FIG. 5) or may have at least one convex portion, for example on the upper face 140 (FIG. 3), in such a way that the corresponding annular electrode 126 can be located in a maximum thickness zone where energy trapping is better.

The embodiment of FIGS. 3 to 5 with an outer active portion has the advantage of permitting the retaining of the crystal by means of two fixing bridges located in the centre of the crystal and which is particularly easy to realise. Thus, there is no difficulty in forming a crystal 1a, 2a having a very thin active peripheral portion 2a and a thinner central portion 1a capable of ensuring a completely adequate support for the complete crystal (FIG. 3). The presence of two electrical conductors, which serve as retaining means and which are disposed on either side of the central portion of the crystal and specifically in the centre thereof give symmetry to the system and ensure a better resistance to accelerations.

FIG. 4 shows a crystal, whose intermediate portion has two perpendicular axes of symmetry with four bridges 34, 34a, 35, 35a separated by recesses 36, 36a, 37, 37a. This configuration, which is also applicable to the embodiment of FIGS. 1 and 2, is in no way limitative.

Figure 8:
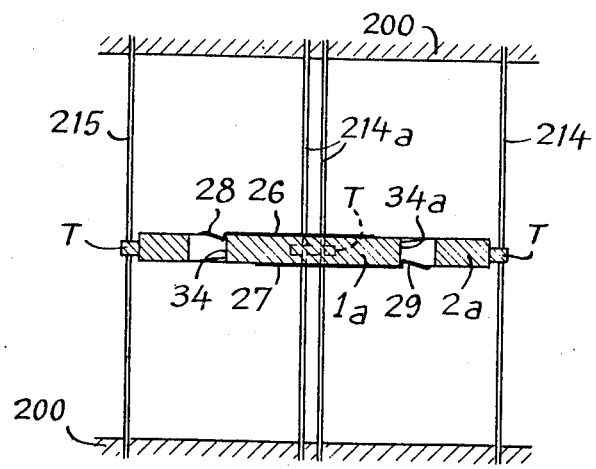
FIG. 8 a sectional view along the line VIII—VIII of FIG. 9 of another embodiment of a resonator according to the invention with a piezoelectric crystal and its suspension means.
Figure 9:
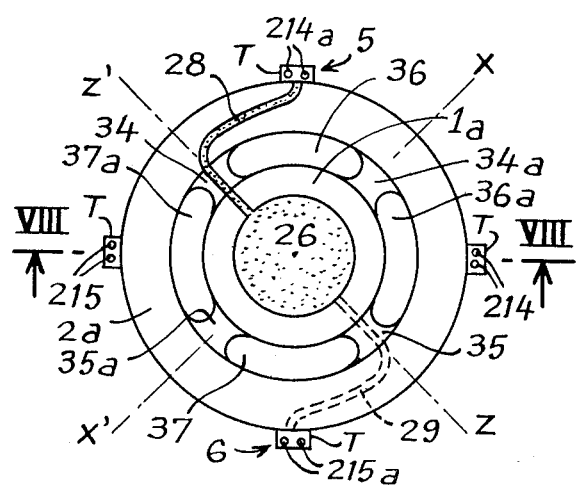
FIG. 9 a plan view of the resonator of FIG. 8.
Figure 10:
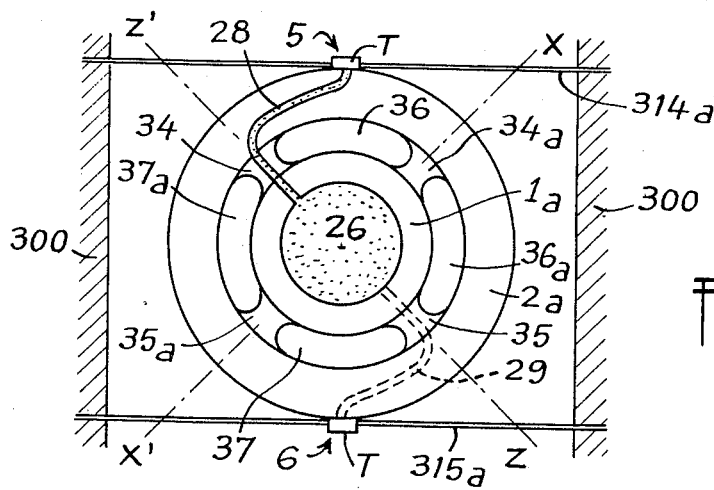
FIG. 10 a plan view of another embodiment of a resonator according to the invention.

FIGS. 8 to 10 show variants of a resonator having an active central portion. In these variants, the suspension of the whole crystal 1a, 2a, which comprises retaining means 5, 6 cooperating with peripheral portion 2a of the crystal, is strictly symmetrical relative to the nodal reference plane of the crystal, located approximately in the centre of the thickness of the crystal. Thus, the lack of sensitivity to accelerations is greatly improved compared with conventional devices in which the retaining means are entirely located on the same side of the piezoelectric crystal.

In FIGS. 8 to 10, elements of the resonator which are similar to elements of devices of FIGS. 1 to 7 carry the same references.

In the embodiment of FIGS. 8 and 9, crystal 1a, 2a is suspended by retaining means 5, 6 formed by wires 214a, 215a, 214, 215 which can be constituted by tapes, cylindrical wires, bifilar wires, or double wires are fixed to the edge of the peripheral portion 2a of the crystal by cementing or preferably by thermocompression bonding level with fixing points T. Wires 214, 215 and 214a, 215a are stretched on a supporting frame 200. The tensions of the strands of wires located on one side of the crystal are the same as the tensions of the strands of wires located on the other side of the crystal, in such a way that in both tension and length each of the wires stretched over frame 200 is symmetrical to the reference nodal plane of the crystal.

In FIG. 9, it is possible to see a crystal 1a, 2a having four bridges 34, 34a, 35, 35a in the form of a cross for connecting the active central portion 1a of the crystal to its peripheral portion 2a. The crystal retaining means 5, 6 comprise wires 214a, 215a which at the same time serve as power supply wires for electrodes 26, 27, and wires 214, 215. The attachment points T of the various suspension wires 214a, 214, 215a, 215 are in a 45° cross arrangement with bridges 34, 34a, 35, 35a.

The resonator of FIGS. 8 and 9 with its crystal, electrodes and suspension means has two rectangular axes of symmetry located in the plane of the crystal. These axes are preferably XX' and ZZ' axes in the case of a section AT. The preferred axes may by analogy be calculated for other types of sections, such as for example a section SC. The resonator of FIGS. 8 and 9 also has the plane of symmetry as the nodal reference plane of the crystal, i.e. the nodal plane which is closest to the centre of the thickness of the crystal. This configuration, which has a very large number of symmetries, is particularly beneficial in as much as it reduces in a significant manner the sensitivity of the resonator to accelerations.

Naturally, the symmetry of the device could be a little less elaborate. For example, the retaining wires 214, 215 could be eliminated. In the case of a crystal having only two diametrically opposite bridges 34, 35 in the intermediate portion, wires 214a, 215a for the power supply of the electrodes and for retaining the crystal are advantageously located in each case at 90° from one of the bridges 34, 35, in such a way that the lever arm constituted by the part of peripheral portion 2a located between fixture T of a wire 214a, 215a and a bridge 34, 35 makes it possible to transmit only greatly reduced stresses to the active central portion 1a. The symmetry of wires 214a, 215a relative to the plane of the crystal also ensures a greater lack of sensitivity to accelerations, as in the case of FIGS. 8 and 9. In the case of the device of FIG. 10, the wires 314a, 315a for supplying the electrodes and which also serve to maintain the crystal in position are located in the nodal reference plane of the crystal or, in the case of bifilar wires, in symmetrical manner relative to said reference nodal plane. Wires 314a, 315a are, as in the case of the embodiment of FIGS. 8 and 9, stretched over a frame 300. The strands of wires 314a, 315a located on either side of the points T of fixing the wires to the edge of the peripheral portion 2a of the crystal are of equal length and are subject to the same mechanical tension. As in the case of the other embodiments, fixing points T are preferably located in the zones of portion 2a which are most remote from connecting bridges 34, 34a, 35, 35a.

The invention is not limited to the embodiments described and represented hereinbefore and various modifications can be made thereto without passing beyond the scope of the invention.

What is claimed is:

1. A piezoelectric resonator comprising a sealed box having substantially less than atmospheric pressure therein; a piezoelectric crystal disposed within said box, said piezoelectric crystal having first and second main opposite faces, a first metal electrode deposited on the first main face of said piezoelectric crystal and a second metal electrode deposited on the second main and opposite face of said piezoelectric crystal; a first conductor connected to the first electrode and extending outside said box; a second conductor connected to the second electrode and extending outside said box; and means for maintaining said piezoelectric crystal within said box, said piezoelectric crystal comprising a central portion and a peripheral portion forming a ring spaced about said central portion and a tapered intermediate portion interconnecting said central portion to said peripheral portion, said tapered intermediate portion having a reduced thickness compared with the thickness of said central and peripheral portions over at least a part thereof between said central and peripheral portions, said first and second electrodes being deposited on said peripheral portion such that said peripheral portion constitutes the active part of said piezoelectric crystal, whilst said maintaining means are coupled to localized zones of said central portion to immobilize the latter in said box, the intermediate portion of said piezoelectric crystal and said immobilized central portion constituting a suspension for the active part of said piezoelectric crystal, and wherein the immobilized central portion of said piezoelectric crystal has a thickness greater than the thickness of said active peripheral portion; and wherein said peripheral portion of said piezoelectric cyrstal is formed, on at least one of said first and second main faces thereof, as a convex portion, the corresponding electrode deposited on said at least one of said first and second main faces being located in a maximum thickness zone of said peripheral portion.

2. A resonator according to claim 1, wherein the conductors are connected to the immobilized central portion of the piezoelectric crystal and are connected to the electrodes by metal deposits made on the immobilized and intermediate portions of the crystal.

3. A resonator according to claim 1, wherein recesses are formed in the tapered intermediate portion of the piezoelectric in such a way that the peripheral portion of the piezoelectric crystal is connected to the central portion of the crystal by a limiting number of bridges constituted by the unrecessed parts of the intermediate portion.

4. A resonator according to claim 3, wherein the bridges are arranged in relation to the edge of the piezoelectric crystal in such a way that the centre of the bridges substantially coincides with the nodal reference plane of the crystal, which is located approximately in the centre of the thickness of the piezoelectric crystal.

5. A resonator according to claim 3, wherein the intermediate portion of the piezoelectric crystal has an even number of bridges ensuring a suspension symmetry of the active portion of the piezoelectric crystal.

6. A resonator according to claim 5, wherein the intermediate portion of the piezoelectric crystal has four radial bridges arranged in 90° cross-like manner relative to one another.

7. A resonator according to claim 3, wherein the bridges connecting the peripheral portion of the piezoelectric crystal to the central portion thereof have their end located on the side of the peripheral portion displaced by a certain angle relative to the end located on the side of the central portion and having lateral curved faces with the same direction of curvature.

8. A resonator according to claim 3, wherein the maintaining means are fixed to the centre of the central portion of the piezoelectric crystal in a substantially symmetrical manner relative to the nodal reference plane of the crystal, which is located approximately in the centre of the thickness of the crystal.

9. A resonator according to claim 1, comprising retaining means for supporting the crystal in the enclosure are constituted by conductor wires for supplying power to the electrodes.

* * * * *

UNITED STATES PATENT OFFICE
CERTIFICATE OF CORRECTION

Patent No. 4,221,986            Dated September 9, 1980

Inventor(s) Raymond J. Besson

It is certified that error appears in the above-identified patent and that said Letters Patent are hereby corrected as shown below:

In the Heading, change

"[73] Assignee: Laboratoires de Physicochimie Appliquees ISSEC and KDP Societe anonyme Keller Dorian Papiers, Lyon, France" to --[73] Assignee: ETAT FRANCAIS represente par le Delegue General pour l'Armement Paris, France--

Signed and Sealed this

Seventh Day of July 1981

[SEAL]

*Attest:*

RENE D. TEGTMEYER

*Attesting Officer*      *Acting Commissioner of Patents and Trademar.*